United States Patent
Jang et al.

(10) Patent No.: US 6,268,294 B1
(45) Date of Patent: Jul. 31, 2001

(54) METHOD OF PROTECTING A LOW-K DIELECTRIC MATERIAL

(75) Inventors: Syun-Ming Jang, Hsin-chu; Shwangming Jeng, Taiwan; Weng Chang, Taipei, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/542,807

(22) Filed: Apr. 4, 2000

(51) Int. Cl.⁷ .................................... H01L 21/46
(52) U.S. Cl. .................. 438/706; 438/723; 438/724
(58) Field of Search ................................ 438/706, 723, 438/724

(56) References Cited

U.S. PATENT DOCUMENTS

| | | | |
|---|---|---|---|
| 5,763,010 | * | 6/1998 | Guo et al. ............... 427/376.2 |
| 5,866,945 | * | 2/1999 | Chen et al. ............... 257/750 |
| 5,869,149 | * | 2/1999 | Denison et al. ........... 427/579 |
| 5,888,898 | * | 3/1999 | Ngo et al. ................ 438/622 |
| 5,899,751 | * | 5/1999 | Chang et al. ............. 438/758 |
| 5,904,566 | * | 5/1999 | Tao et al. ................ 438/689 |
| 5,918,146 | * | 6/1999 | Yamashita ............... 438/631 |
| 5,942,801 | * | 8/1999 | Tran ...................... 257/758 |

* cited by examiner

*Primary Examiner*—Benjamin L. Utech
*Assistant Examiner*—Charlotte A. Brown
(74) *Attorney, Agent, or Firm*—George O. Saile; Stephen B. Ackerman (57) ABSTRACT

A method for forming a dual damascene conductor interconnection layer within an inter-level metal dielectric (IMD) layer formed upon a substrate employed within a microelectronics fabrication. There is provided a substrate employed within a microelectronics fabrication. There is then formed over the substrate a series of conductor lines. There is then formed over the substrate a dielectric layer. There is then formed over the dielectric layer an intermediate second dielectric layer. There is then formed over the substrate a patterned photoresist etch mask layer. There is then etched the pattern of the photoresist etch mask-layer into and through the dielectric layers, followed by stripping the photoresist layer. There is then treated the exposed dielectric layer surface to a reactive gas to form a reacted surface layer. There may then be formed over the substrate additional patterned photoresist etch mask layers, with attenuated degradation of the dielectric layers due to the organic materials and methods for cleaning and stripping same.

16 Claims, 3 Drawing Sheets

METHOD OF PROTECTING A LOW-K DIELECTRIC MATERIAL

BACKGROUND OF THE INVENTION

1. Field of the Invention

The present invention relates to the field of fabrication of microelectronics devices. More particularly, the present invention relates to the fabrication of inter-level metal dielectric (IMD) layers employed within microelectronics fabrications.

2. Description of the Related Art

Microelectronics devices are becoming increasingly complex and the density of circuits has increased as dimensions have shrunk. It has become necessary to have additional levels of interconnection wiring to handle this increase in need. For this reason, multiple levels of conductor and dielectric materials are now commonly employed within microelectronics fabrications. In addition to the necessary properties such materials must have to fulfill the needs of conduction and insulation, there are the increasingly demanding requirements upon patterning method, electrical contact resistance control, dielectric constant and so forth.

In order to facilitate multiple levels of interconnection wiring, there has been developed an inter-level metal dielectric (IMD) layer technology for microelectronics fabrication. This type of structure employs lower conductor level separated from an upper conductor level by means of an intermediate dielectric layer or layers with electrical via contacts therewith to interconnect the conductor layers. There are several variations on the basic IMD approach, and one of the more common IMD methods employs recessed wiring layers within the dielectric layer to maintain surface planarity as the number of levels increase. When both the via contact openings and the inlaid trench for the wiring pattern are filled with a conductor material, the entire system is referred to as a "dual damascene" IMD layer. The openings for the via contact layer and the wiring trench for the interconnection layer are generally formed employing photoresist technology as is known in the art of microelectronics fabrication.

Although the dual damascene conductor interconnection layer inlaid within an IMD layer is a method which is in general satisfactory, this IMD layer technology is not without problems. For example, it is often desirable to employ low dielectric constant dielectric material to form one or more of the dielectric layers in an IMD layer, in order to reduce capacitance. Many low dielectric constant dielectric materials with otherwise excellent properties are formed of organic polymers, and there is occasionally an incompatibility with photoresist materials, which are also organic polymers formulated with solvents, which may interact with the organic polymer low dielectric constant materials. Likewise, after employment of photoresist material to form either the via openings or the wiring trench pattern of a dual damascene interconnection structure, it is often difficult to remove photoresist residues without simultaneously damaging the low dielectric constant dielectric layer.

It is thus towards the goal of forming an inter-level metal dielectric (IMD) layer employing low dielectric constant dielectric materials and a dual damascene interconnection scheme with attenuated degradation from interaction with organic material residues that the present invention is directed.

Various methods have been disclosed for providing inter-level metal dielectric (IMD) layers with attenuated degradation from organic material residues and common cleaning and stripping procedures.

For example, Gue et al., in U.S. Pat. No. 5,763,010, disclose a method for reduction of migration of dopant atoms from halogen-doped silicon oxide dielectric films during processing. The method employs a prior heating step at between 300 and 350 degrees centigrade to outgas loosely bonded halogen atoms from the doped silicon oxide film, thus stabilizing the remaining halogen atoms during subsequent processing.

Further, Chen et al., in U.S. Pat. No. 5,866,945, disclose a method for reduction of degradation of silsesquioxane (HSQ) dielectric layers due to subsequent photoresist processing. The method employs plasma treatment of the HSQ dielectric layer to restore Si—H bonds and thus passivate the surface of the HSQ dielectric layer with respect to damage resulting from subsequent photoresist processing such as stripping with an oxygen-containing plasma.

Yet further, Denison et al. in U.S. Pat. No. 5,869,149, disclose a method for forming a fluorine containing silicon oxide with enhanced moisture resistance. The methods forms first a fluorine-containing silicon oxide layer by plasma enhanced chemical vapor deposition (PECVD) followed by nitridation of the surface of the fluorine-doped silicon oxide layer employing a nitriding gas in a plasma at a temperature above 300 degrees centigrade. The nitriding gas may be nitrogen, nitrous oxide and/or ammonia.

Still further, Ngo et al., in U.S. Pat. No. 5,888,898, disclose a method for forming a low dielectric constant dielectric layer with minimized dielectric constant. The method first forms a silsesquioxane (HSQ) low dielectric constant dielectric layer which is baked in an inert nitrogen atmosphere followed by soaking in a nitrous oxide atmosphere for 10 seconds. A layer of PECVD silicon oxide is then formed over the HSQ layer.

Yet still further, Chang et al., in U.S. Pat. No. 5,899,751, disclose a method for forming a planarized dielectric layer employing silsesquioxane (HSQ) dielectric material, with improved thermal stability and dielectric constant. The method employs dissolving HSQ dielectric material in a solvent, casting a layer and allowing the solvent to evaporate. The remaining HSQ layer is heat treated from between 150 to 400 degrees centigrade to form a silica coated later. A fluoride implant treatment is then employed.

Further still, Tao et al., in U.S. Pat. No. 5,904,566, disclose a method for forming a via through a nitrogenated silicon oxide dielectric layer. The method first forms a nitrogenated silicon oxide dielectric layer, followed by employment of a patterned photoresist etch mask and a reactive plasma etch to etch the pattern of via holes through the nitrogenated silicon oxide dielectric layer.

Yet further still, Yamashita, in U.S. Pat. No. 5,918,146, discloses a method for forming an inter-level metal dielectric layer with improved planarization obtained by reflow of the dielectric layer. The method forms silicon oxide dielectric layers employing aromatic or heterocyclic organic compounds reacting first with an oxidant to form a product layer with reflowed planarized surface. The layer is then converted by heat treatment to form a silicon oxide dielectric layer with excellent planarity and a low dielectric constant.

Finally, Tran, in U.S. Pat. No. 5,942,801, discloses a method for forming silsesquioxane (HSQ) dielectric layers in which may be formed via holes with improved properties. The method employs local heating of the HSQ dielectric layer to increase the density and etch resistance in regions where via holes are to be formed. Local heating may be accomplished by heating an adjacent metal line to afford local infrared heating.

Desirable in the art of microelectronics fabrication are additional methods for forming inter-metal dielectric (IMD) dielectric layers with patterned conductor layers and via hole contact layers formed therein with attenuated degradation from organic material residues and means for cleaning and stripping same.

SUMMARY OF THE INVENTION

A first object of the present invention is to provide a method for forming a dual damascene conductor interconnection layer within an inter-level metal dielectric (IMD) layer with attenuated degradation caused by organic materials and methods employed for cleaning and stripping same.

A second object of the present inventions to provide a method in accord with the first object of the present invention where the inter-level metal dielectric (IMD) layer is formed employing a low dielectric constant dielectric material with attenuated degradation caused by photoresist, organic material residues and cleaning and stripping methods employed to remove same.

A third object of the present invention is to provide a method in accord with the first object of the present invention and the second object of the present invention which method is readily commercially implemented.

In accord with the objects of the present invention, there is provided a method for forming a dual damascene interconnection conductor layer within an inter-level metal dielectric (IMD) layer employing low dielectric constant dielectric material having attenuated degradation due to organic materials and cleaning and stripping methods employed to remove same. To practice the invention, there is provided a substrate employed within a microelectronics fabrication. There is formed over the substrate at least one dielectric layer employing a low dielectric constant dielectric material. There is then formed over the substrate a second dielectric layer. There is then formed a series of via holes through the first and second dielectric layers employing subtractive etching through a photoresist etch mask layer. There is then expose the substrate to a reactive gas environment to form a chemically reacted layer on the surface of the dielectric layer and via holes, such that during subsequent operations employing photoresist etch mask layers and their stripping and removal, there is attenuated any degradation of the dielectric layers due to the presence of the reacted surface layer.

The present invention is useful for employment upon a substrate employed within microelectronics fabrications including but not limited to integrated circuit microelectronics fabrications, charge coupled device microelectronics fabrications, solar cell microelectronics fabrications, optoelectronics microelectronics fabrications, ceramic substrate microelectronics fabrications and flat panel display microelectronics fabrications.

The method of the present invention employs methods and materials as are known in microelectronics fabrication, but in a novel order and sequence. Therefore the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a part of this disclosure, wherein.

DESCRIPTION OF THE PREFERRED EMBODIMENTS

The present invention provides a method for forming upon a substrate employed within a microelectronics fabrication an inter-level metal dielectric (IMD) layer with attenuated degradation from contact with organic materials, residues and methods employed for stripping and cleaning same.

First Preferred Embodiment

Figure 1:
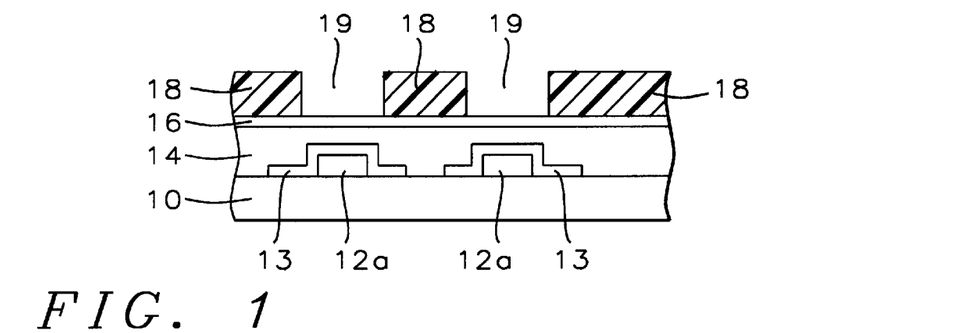
FIG. 1, FIG. 2, FIG. 3, and FIG. 4 are a seris of schematic cross-sectional diagrams illustrating the results of forming upon a substrate employed within a microelectronics fabrication an inter-level metal dielectric (IMD) layer with attenuated degradation from organic materials and methods employed for stripping and cleaning same.

Referring now more particularly to FIG. 1–5, there is shown a series of schematic cross-sectional diagrams illustrating the results of forming upon a substrate employed within a microelectronics fabrication an inter-level metal dielectric (IMD) layer with attenuated degradation from contact with organic materials and residues as well as methods for cleaning and stripping same. FIG. 1 is a schematic cross-sectional diagram of a microelectronics fabrication at an early stage in its fabrication in accord with a general embodiment of the present invention which constitutes a first preferred embodiment of the present invention.

Shown in FIG. 1 is a substrate 10 employed within a microelectronics fabrication. Formed over the substrate is a series of patterned microelectronics conductor lines 12a and 12b which constitute a patterned microelectronics conductor layer. Formed over the substrate 10 and patterned conductor layer is an optional patterned intermediate layer 13. Formed over the substrate is a blanket first dielectric layer 14. Formed over the blanket first dielectric layer 14 is a blanket second dielectric intermediate layer 16. Formed over the substrate is a patterned photoresist etch layer 18 having a series of patterned openings 19a and 19b.

With respect to the substrate 10 shown in FIG. 1, the substrate 10 may be the substrate itself employed in the microelectronics fabrication, or alternatively the substrate 10 may be any of several layers of microelectronics materials formed upon the substrate. The substrate may be formed microelectronics materials chosen from the group consisting of microelectronics conductor materials, microelectronics semiconductor materials and microelectronics dielectric materials. Preferably the substrate 10 is a semiconductor substrate With respect to the series of microelectronics lines 12a and 12b shown in FIG. 1, the series of microelectronics lines 12a and 12b may be formed from microelectronics materials selected from the group consisting of microelectronics conductor materials, microelectronics semiconductor materials and microelectronics dielectronics materials. Preferably the microelectronics lines 12a and 12b are formed from microelectronics conductor materials including but not limited to microelectronics metals, alloys, semiconductors and conductive compounds.

With respect to the patterned optional intermediate layer 13 shown in FIG. 1, the patterned optional intermediate layer 13 may be formed employing microelectronics materials including microelectronics conductor materials, microelectronics semiconductor materials and microelectronics dielectric materials as are known in the art of microelectronics fabrication. Preferably the patterned optional intermediate layer 13 may be employed, for example, as a barrier layer; alternatively the patterned intermediate layer 13 may be employed to improve electrical contact to a conductor layer or, as a further alternative, the patterned intermediate layer 13 may be employed as an etch stop layer.

With respect to the first blanket dielectric layer 14 shown in FIG. 1, the first blanket dielectric layer 14 is formed employing a low dielectric constant dielectric material. Preferably the low dielectric constant dielectric material is a fluorinated organic polymer dielectric material or, alternatively, a carbon doped silicon containing dielectric material such as, for example, silsesquioxane (HSQ) polymer spin-on-polymer (SOP) dielectric material.

With respect to the second intermediate dielectric layer 16 shown in FIG. 1, the second intermediate dielectric layer 16 is a silicon containing dielectric material employed as an anti-reflection coating (ARC) dielectric layer. Preferably the second intermediate dielectric layer 16 is a silicon oxynitride dielectric layer formed employing chemical vapor deposition (CVD) as is well known in the art of microelectronics fabrication.

With respect to the first patterned photoresist etch mask layer 18 shown in FIG. 1, the first patterned photoresist etch mask layer 18 is formed into a pattern 19 employing photolithographic materials and methods as are well known in the art of microelectronics fabrication. The pattern 19 may be the pattern of a series of via contact holes between underlying conductor layers and any subsequently formed overlying conductor layers.

Figure 2:
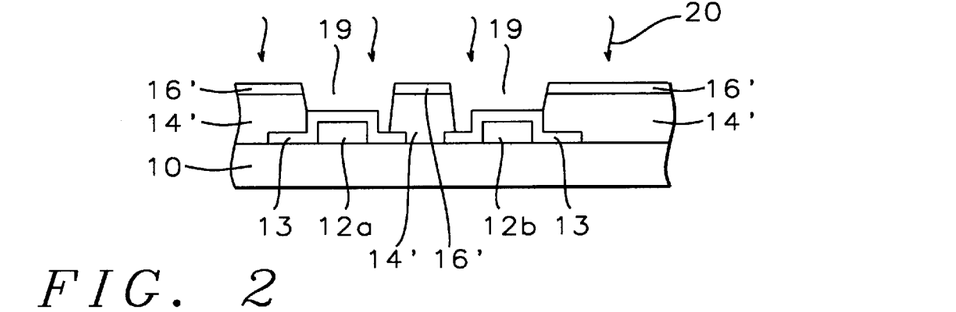

Referring now more particularly to FIG. 2, there is shown a schematic cross-sectional diagram illustrating the results of further processing of the microelectronics fabrication whose schematic cross-sectional diagram is shown in FIG. 1 in accord with the first embodiment of the present invention. Shown in FIG. 2 is a microelectronics fabrication otherwise equivalent to the microelectronics fabrication shown in FIG. 1, but where there has been etched the pattern 19 employing a reactive etching environment 20 and the first patterned photoresist etch mask 18, followed by stripping of the first patterned photoresist etch mask 18.

With respect to the etching of the pattern 19 shown in FIG. 2, the etching of the pattern 19 may be accomplished employing methods and materials as are well known in the art of microelectronics fabrication in accord with the nature of the material employed in dielectric layers 14 and 16.

Figure 3:
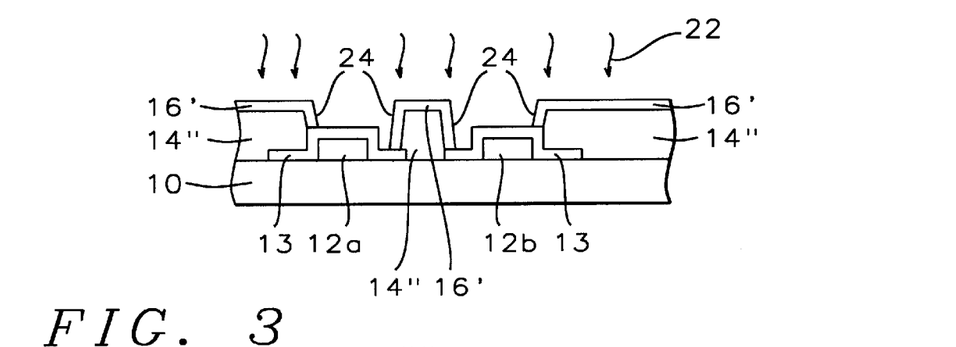

Referring now more particularly to FIG. 3, there is shown a schematic cross-sectional diagram illustrating the results of further processing of the microelectronics fabrication whose schematic cross-sectional diagram is shown is FIG. 2 in accord with the first preferred embodiment of the present invention.. Shown in FIG. 3 is a microelectronics fabrication otherwise equivalent of the microelectronics fabrication shown in FIG. 2, but where there has been treated the substrate to a reactive gas environment 22 to form a reacted surface layer 24.

With respect to the reactive gas environment 22 shown on FIG. 3, the reactive gas environment 22 is chosen from a group including but not limited to oxygen, nitrous oxide ($N_2O$) and ammonia ($NH_3$).

Figure 4:
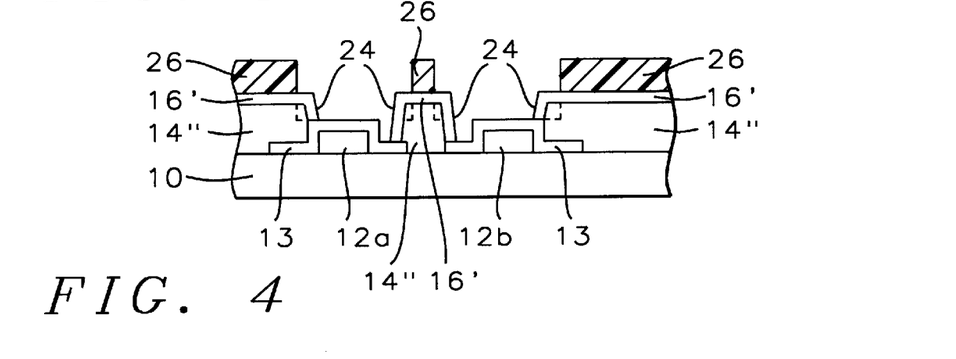

Referring now more particularly to FIG. 4, there is shown a schematic cross-sectional diagram illustrating the results of further processing of the microelectronics fabrication whose schematic cross-sectional diagram is shown in FIG. 3 in accord with the first preferred embodiment of the present invention. Shown in FIG. 4 is a microelectronics fabrication otherwise equivalent to the microelectronics fabrication shown in FIG. 3, but where there has been formed over the substrate a second patterned photoresist etch mask layer 26.

With respect to the second patterned photoresist etch mask layer 26 shown in FIG. 4, the second patterned photoresist etch mask layer 26 has been formed and patterned, employing methods and materials as are well known in the art of microelectronics fabrication with attenuated degradation of the underlying dielectric layer 14 and intermediate layer 16 because of the presence of the reacted layer 24 which acts as a barrier layer. The patterned photoresist etch mask layer 26 serves to permit the formation of the optional etched pattern shown as dotted lines in FIG. 4 to allow, for example, the formation of the wiring trench pattern for a dual damascene conductor layer.

The first preferred embodiment of the present invention provides a methof for forming upon a substrate employed within a microelectronics fabrication an inter-level metal dielectric (IMD) layer with attenuated degradation of the dielectric layer from interaction with photoresist layers and organic material residues and methods for stripping and cleaning same.

Second Preferred Embodiment

Figure 5:
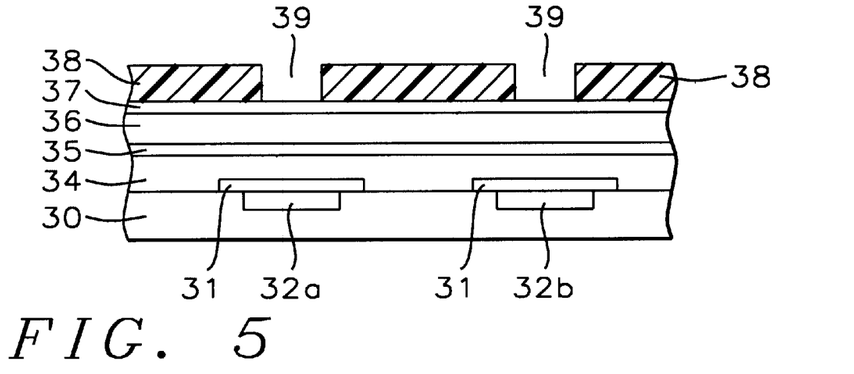
FIG. 5, FIG. 6, FIG. 7, FIG. 8, FIG. 9 and FIG. 10 are a series of schematic cross-sectional diagrams illustrating the results of forming upon a semiconductor substrate employed within an integrated circuit microelectronics fabrication a dual damascene conductor interconnection layer within an inter-metal dielectric (IMD) layer formed employing a low dielectric constant dielectric material, with attenuated degradation from contact with photoresist, organic materials and residues and the methods employed in stripping and cleaning same.

Referring now to FIG. 5–10, there is shown a series of schematic cross-sectional diagrams illustrating the formation upon a semiconductor substrate employed within an integrated circuit microelectronics fabrication of a dual damascene conductor interconnection layer within an inter-level metal dielectric (IMD) layer, formed employing a low dielectric constant dielectric material, with attenuated degradation due to contact with organic materials, residues and the means employed for cleaning and stripping same. FIG. 5 is a schematic cross-sectional diagram of an integrated circuit fabrication at an early stage in its fabrication in accord with a more specific embodiment of the present invention which constitutes a second preferred embodiment of the present invention.

Shown in FIG. 5 is a silicon semiconductor substrate 30 within which is formed a series of conductive regions 32a and 32b which constitute a patterned microelectronics conductor layer. Formed over the substrate 30 and patterned microelectronics conductor layer is a patterned intermediate layer 31. Formed over the silicon semiconductor substrate is a first low dielectric constant dielectric layer 34. Formed over the first low dielectric constant dielectric layer 34 is an intermediate dielectric etch stop layer 35. Formed over the intermediate dielectric etch stop layer 35 is a second low dielectric constant dielectric layer 36. Formed over the second low dielectric constant dielectric layer 36 is an anti-reflection coating (ARC) dielectric layer 37. Formed over the silicon semiconductor substrate is a first patterned photoresist etch mask layer 38 formed into a pattern 39.

With respect to the silicon semiconductor substrate 30 shown in FIG. 5, the silicon semiconductor substrate 30 is analogous to the substrate shown in FIG. 1 of the first preferred embodiment of the present invention. Preferably the silicon semiconductor substrate 30 is a single crystalline silicon wafer with crystalline orientation (100). With respect to the patterned intermediate layer 31 shown in FIG. 5, the patterned intermediate layer 31 is preferably a silicide conductor layer.

With respect to the series of conductor regions 32a and 32b shown in FIG. 5, the series of conductor regions are analogous to the series of microelectronics material lines 12a and 12b shown in FIG. 1 of the first preferred embodiment of the present invention. The series of conductor regions 32a and 32b are formed within or upon the silicon semiconductor substrate 30 employing methods and materials as are known in the art of microelectronics fabrication including but not limited to chemical vapor deposition (CVP), physical vapor deposition (PVD) sputtering, electrodeposition, ion plating, thermal diffusion and ion implantation. Preferably the series of conductor lines 32a and 32b are formed employing thermal diffusion of dopant atoms into the semiconductor substrate 30.

With respect to the patterned intermediate layer 31 shown in FIG. 5, the patterned intermediate layer 31 is analogous to the optional first intermediate layer 13 shown in FIG. 1 of the first preferred embodiment of the present invention.

With respect to the first low dielectric constant dielectric layer 34 shown in FIG. 5, the first low dielectric constant dielectric layer 34 is analogous to the first dielectric layer 14 shown in FIG. 1 of the first preferred embodiment of the present invention. Preferably the first low dielectric constant dielectric layer 34 is formed from a low dielectric constant dielectric material such as, for example, carbon doped silicon containing silsesquioxane (HSQ) dielectric material or fluorinated poly (arylene ether) dielectric material employing spin-on-polymer (SOP) dielectric material; alternatively the low dielectric constant dielectric layer 34 may be formed by plasma enhanced chemical vapor deposition (PECVD) methods employing fluorine doped dielectric materials as are known in the art of microelectronics fabrications. Preferably the low dielectric constant dielectric materials is, for example, a material such as SILK fluorinated organic polymer spin-on-polymer (SOP) material commercially available from Dow Chemical Co. Midland, Mich. (U.S.A.).

With respect to the intermediate etch stop dielectric layer 35 shown in FIG. 5, the intermediate etch stop dielectric layer 35 is a silicon nitride layer formed employing methods which are known in the art of microelectronics fabrication including but not limited to chemical vapor deposition (CVD) and plasma enhanced chemical vapor deposition (PECVD).

With respect to the second low dielectric constant dielectric layer 36 shown in FIG. 5, the second low dielectric constant dielectric layer 36 is analogous to the first dielectric layer 14 shown in FIG. 1 of the first preferred embodiment of the present invention. Preferably the second low dielectric constant dielectric layer 36 is formed employing organic polymer spin-on-polymer (SOP) low dielectric constant dielectric material such as fluorinated poly (arylene ether), commercially available as FLARE from Allied Signal Corporation, for example; alternatively, the fluorinated organic polymer spin-on-polymer SILK may be employed, commercially available from Dow Chemical Company, Midland, Mich. (U.S.A.).

With respect to the anti-reflection coating (ARC) dielectric layer 37 shown in FIG. 5, the anti-reflection coating (ARC) dielectric layer 37 is a silicon oxynitride dielectric layer formed employing chemical vapor deposition (CVD) method as is known in the art of microelectronics fabrication.

With respect to the first patterned photoresist etch mask layer 38 having formed in it the pattern 39 shown in FIG. 5, the first patterned photoresist etch mask layer 38 and pattern 39 are analogous to the patterned photoresist pattern 16 and pattern 17 shown in FIG. 1 of the first preferred embodiment of the present invention. The pattern 39 formed in the patterned photoresist etch mask layer 38 may be, for example, the via contact hole interconnection pattern for a dual damascene interconnection layer.

Figure 6:
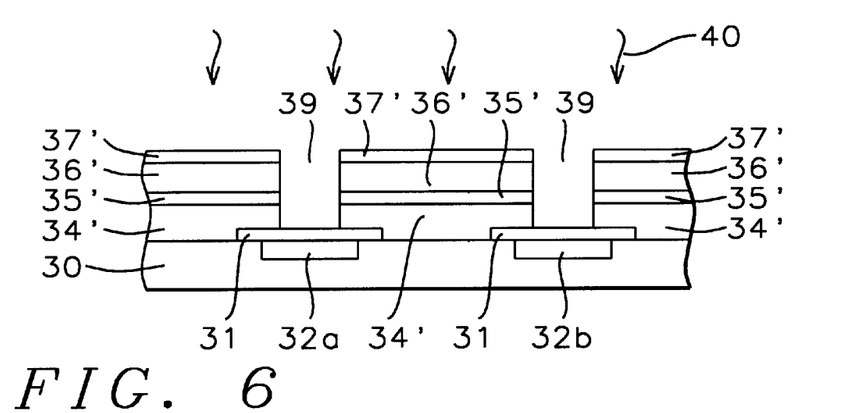

Referring now more particularly to FIG. 6, there is shown a schematic cross-sectional diagram illustrating the results of further processing of the integrated circuit microelectronics fabrication whose schematic cross-sectional diagram is shown in FIG. 5 in accord with the second preferred embodiment of the present invention. Shown in FIG. 6, is an integrated circuit microelectronics fabrication otherwise equivalent to the integrated circuit microelectronics fabrication shown in FIG. 5, but where there has been etched employing a reactive ion etching environment 40 and the photoresist etch mask layer 38 the pattern 39 into the through the second dielectric layer 36, the etch top layer 35 and the first dielectric layer 34 to the barrier layer 31, followed by stripping of the photoresist etch mask layer 38.

With respect to the reactive etching environment 40 shown in FIG. 6, the reactive etching environment is a plasma-activated reactive ion etching environment as is well known in the art of microelectronics fabrication.

Figure 7:
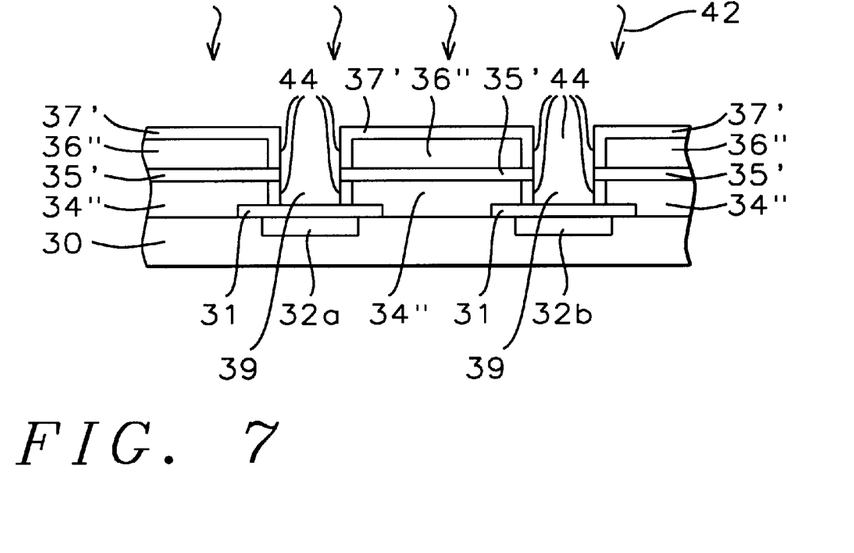

Referring now more particularly to FIG. 7, there is shown a schematic cross-sectional diagram illustrating the results of further processing of the integrated circuit microelectronics fabrication whose schematic cross-sectional diagram is shown in FIG. 6. Shown in FIG. 7 is an integrated circuit microelectronics fabrication otherwise to the integrated circuit microelectronics fabrications shown in FIG. 6, but where there has been treated the silicon semiconductor substrate to a reactive gas 42 which forms a reacted surface layer 44.

With respect to the reactive gas 42 shown in FIG. 7, the reactive gas 42 is selected from the group consisting of oxygen, nitrogen, nitrous oxide ($N_2O$) and ammonia ($NH_3$) so that there is a an appropriate chemical reaction at the surfaces of the etched pattern 39 depending on the particular material. Preferably the low dielectric constant dielectric layers are formed of carbon-doped silicon containing silsesquioxane (HSQ) dielectric material, and the surface is treated for about 10 to about 30 minutes at a temperature of about 300 degrees centigrade to a mixture of oxygen- and nitrogen-containing gases such as oxygen, nitrogen, nitrous oxide and ammonia to form an oxidized and/or nitride surface layer 44.

With respect to the reacted surface layer 44 shown in FIG. 7, the oxidized and/or nitride surface layer 44 is analogous to the reacted surface layer 22 shown in FIG. 3 of the first preferred embodiment of the present invention.

Figure 8:
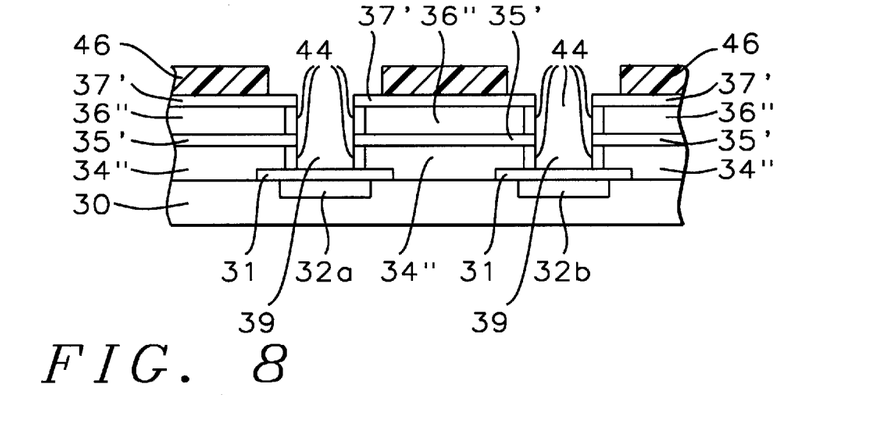

Referring now more particularly to FIG. 8, there is shown a schematic cross-sectional diagram illustrating the results of further processing of the integration circuit microelectronics fabrication whose schematic cross-sectional diagram is shown in FIG. 7 in accord with the second preferred embodiment of the present invention. Shown in FIG. 8 is an integrated circuit microelectronics fabrication otherwise equivalent to the integrated circuit microelectronics fabrication shown in FIG. 7, but where there has been formed a second patterned photoresist etch mask layer 46 having a pattern 47 over the substrate.

With respect to the second patterned photoresist etch mask pattern 46 shown in FIG. 8, the second patterned photoresist etch mask layer 46 is analogous to the patterned photoresist etch mask layer 20' shown in FIG. 4 of the first preferred embodiment of the present invention. The patterned 47 formed in the second patterned photoresist etch mask pattern 46 may be the wiring trench pattern of a dual damascene conductor interconnection pattern. The patterned photoresist etch mask layer 46 has been formed and patterned over the substrate with attenuated degradation of the underlying dielectric layers because of the non-reactive protective nature of the oxidized surface layer 14.

Figure 9:
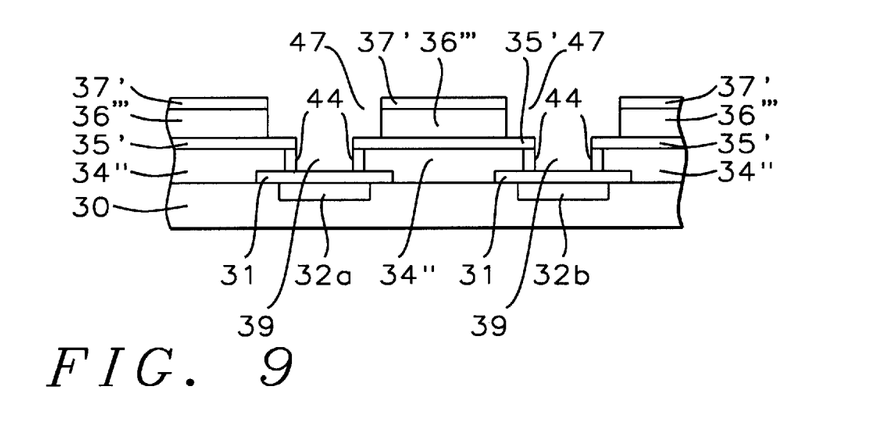

Referring now more particularly to FIG. 9, there is shown a schematic cross-sectional diagram illustrating the results of further processing of the integrated circuit microelectronics fabrication whose schematic cross-sectional diagram is shown in FIG. 8. Shown in FIG. 9 is an integrated circuit microelectronics fabrication otherwise equivalent to the integrated circuit microelectronics fabrication shown in FIG. 8, but where there has been etched the pattern 47 through the second patterned photoresist etch mask layer 46 and into and through the second dielectric layer 36 to the etch stop dielectric layer 35, employing a reactive etching environment 48.

With respect to the reactive etching environment 48 shown in FIG. 9, the reactive etching environment 48 is analogous or equivalent to the reactive environment 22 shown in FIG. 2 of the first preferred embodiment of the present invention.

The information of the etched pattern 47 in FIG. 9 has been accomplished with attenuated degradation of underlying dielectric layers and surfaces from the photoresist layer, process residues and stripping of the photoresist because of the protective oxidized surface layer 44.

Figure 10:
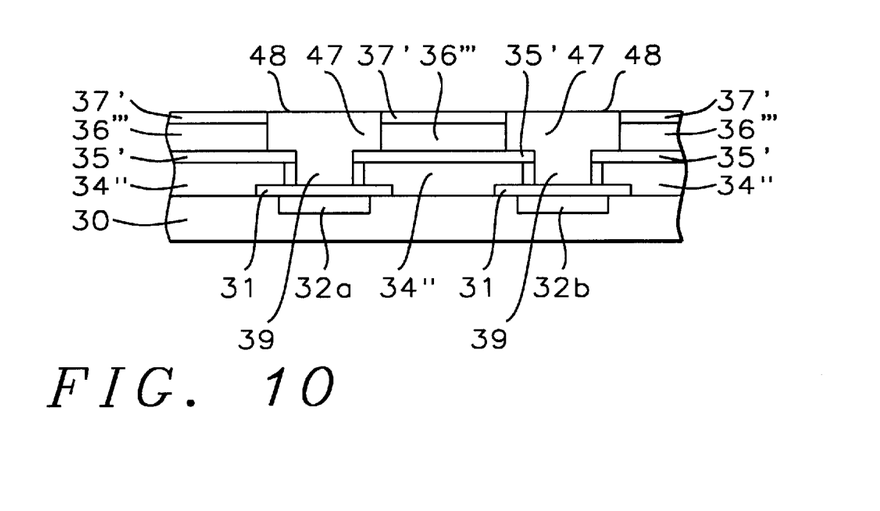

Referring now more particularly to FIG. 10, there is shown a schematic cross-sectional diagram illustrating the results of further processing of the integrated circuit microelectronics fabrication whose schematic cross-sectional diagram is shown in FIG. 9 in accord with the second preferred embodiment of the present invention. Shown in FIG. 10 is an integrated circuit microelectronics fabrication otherwise equivalent to the integrated circuit microelectronics fabrication shown in FIG. 9, but where there has been filled the via contact hole and trench pattern with conductor material 48 to complete the dual damascene conductor interconnection layer within the inter-metal dielectric (IMD) layer.

With respect to the conductor material filling the via hole and trench pattern 48 shown in FIG. 10, the conductor material filling the via hole and trench pattern 48 has been formed employing materials and methods which are known in the art of microelectronics fabrication including but not limited to vacuum evaporation, physical vapor deposition (PVD) sputtering, chemical vapor desposition (CVD), electrodeposition (ED) and ion plating. Preferably all or most of the conductor material filling the etched via hole and wiring trench patterns is copper metal formed employing a electrodeposition (ED) method.

The second preferred embodiment of the present invention provides a method for forming upon a semiconductor substrate employed within an integrated circuit microelectronics fabrication a dual damascene interconnection conductor layer formed within an inter-metal dielectric (IMD) layer employing a low dielectric constant dielectric material, with attenuated degradation of the low dielectric constant dielectric layers due to contact with organic materials and means to remove same.

As is understood by a person skilled in the art, the embodiments of the present invention are illustrative of the present invention rather than limiting of the present invention. Modifications may be made to materials, structures and dimensions through which is provided the preferred embodiments of the present invention while still providing embodiments which are within the spirit and scope of the present invention.

What is claimed is:

1. A method for forming upon a substrate employed within a microelectronics fabrication an inter-level metal dielectric (IMD) layer with attenuated degradation of the dielectric layer from interaction with organic materials comprising:

providing a substrate employed within a microelectronics fabrication;

forming upon the substrate a series of microelectronics conductor lines;

forming over the substrate a first low dielectric constant dielectric layer employing a poly(arylene) ether polymer spin-on-polymer (SOP) low dielectric constant dielectric material;

forming over the substrate a second intermediate dielectric layer;

forming over the substrate a first a patterned photoresist etch mask layer;

etching the pattern of the first patterned photoresist etch mask layer into and through the dielectric layers;

stripping the photoresist etch mask layer;

treating the surface of the dielectric layers to a reactive gas environment to form a protective reacted surface layer;

forming and patterning upon the substrate a second photoresist mask layer; and processing and stripping the second patterned photoresist etch mask layer with attenuated degradation of the dielectric layers due to the organic materials and methods used in processing same because of the protective reacted surface layer on the exposed dielectric layers.

2. The method of claim 1 wherein the reacted surface layer results in attenuated degradation of the dielectric layers from organic materials and methods for employing same.

3. The method of claim 1 wherein the substrate is formed of material selected from the group consisting of:

microelectronics conductor materials;

microelectronics semiconductor materials; and microelectronics dielectrics materials.

4. The method of claim 1 wherein the substrate is employed within a microelectronics fabrication selected from the group consisting of:

integrated circuit microelectronics fabrications;

charge couple device microelectronics fabrications;

solar cell microelectronics fabrications;

optoelectronics microelectronics fabrications;

ceramic substrate microelectronics fabrications; and flat panel display microelectronics fabrications.

5. The method claim 1 wherein the series of microelectronics conductor lines is formed of microelectronics conductor material selected from the group consisting of:

metals;

alloys;

semiconductors;

conductive compounds.

6. The method of claim 1 wherein the second intermediate dielectric layer is a silicon oxynitride anti-reflection coating (ARC) dielectric layer formed employing chemical vapor deposition (CVD).

7. The method of claim 1 wherein the reactive gas is selected from the group consisting of:

oxygen;

nitrous oxide;

ammonia; and nitrogen.

8. A method for forming upon a semiconductor substrate employed within an integrated circuit microelectronics fabrication a dual damascene conductor interconnection layer formed within an inter-level metal dielectric (IMD) layer formed employing low dielectric constant dielectric material, with attenuated degradation of the dielectric layers from organic materials and methods used to process same, comprising;

providing a semiconductor substrate having formed therein conductive regions employed within an integrated circuit microelectronics fabrication;

forming over the substrate a first intermediate layer;

forming over the substrate a first low dielectric constant dielectric layer employing a polymer poly(arylene) ether spin-on-polymer (SOP) low dielectric constant dielectric material;

forming over the first low dielectric constant dielectric layer an intermediate dielectric etch stop layer;

forming over the etch stop layer a second low dielectric constant dielectric layer;

forming over the second low dielectric constant dielectric layer a third intermediate anti-reflection coating (ARC) dielectric layer;

forming over the substrate a first patterned photoresist etch mask layer;

etching the pattern of the first patterned photoresist etch mask layer into and through the ARC dielectric layer, second low dielectric constant dielectric layer, etch stop dielectric layer and first low dielectric constant dielectric layer to underlying conductor layer;

stripping the first patterned photoresist etch mask layer;

treating the surface of the dielectric layers to a reactive gas environment to form a protective reacted surface layer on the exposed dielectric surfaces;

forming over the semiconductor substrate a second patterned photoresist etch mask layer;

etching the pattern of the second photoresist etch mask layer into and through the second low dielectric constant dielectric layer to the intermediate etch stop dielectric layer;

stripping the photoresist etch mask layer; and filling the etched via hole and trench pattern with conductor material to complete a dual damascene conductor interconnection layer within a low dielectric constant inter-level metal dielectric (IMD) layer with attenuated degradation of dielectric layers caused by organic materials and the means employed to process same, due to the protective reacted surface layer on the exposed dielectric layers.

9. The method of claim 8 wherein the reacted surface layer provides attenuated degradation of the dielectric layers from organic materials and the methods employed for cleaning and stripping same.

10. The method of claim 8 wherein the semiconductor substrate is a silicon semiconductor substrate.

11. The method of claim 8 wherein the first intermediate layer is a barrier layer to prevent diffusion between the substrate conductor regions and subsequent conductor material layer.

12. The method of claim 8 wherein the first low dielectric constant dielectric layer is formed employing spin-on-polymer (SOP) dielectric material selected from the group consisting of:

fluorinated poly(arylene ether ) spin-on-polymer (SOP) low dielectric constant dielectric material; and carbon-doped silicon containing silsesquioxane spin-on-polymer (SOP) low dielectric constant dielectric material.

13. The method of claim 8 wherein the intermediate dielectric etch stop layer is a silicon nitride layer formed employing chemical vapor deposition (CVD).

14. The method of claim 8 wherein the third intermediate anti-reflection coating (ARC) dielectric layer is a silicon oxynitride layer formed employing chemical vapor deposition (CVD).

15. The method of claim 8 wherein the reactive gas environment is selected from the group consisting of:

oxygen;

nitrous oxide;

ammonia; and nitrogen.

16. The method of claim 8 wherein the conductor material is copper metal.

\* \* \* \* \*

UNITED STATES PATENT AND TRADEMARK OFFICE
CERTIFICATE OF CORRECTION

PATENT NO.   : 6,268,294 B1
DATED        : July 31, 2001
INVENTOR(S)  : Syun-Ming Jang, Shwangming Jeng and Weng Chang It is certified that error appears in the above-identified patent and that said Letters Patent is hereby corrected as shown below:

Title page,
Item [75], please delete "Taiwan" and replace it with -- Hsin-Chu -- after the second inventor's name.

Signed and Sealed this

Twenty-first Day of May, 2002

Attest:

JAMES E. ROGAN
*Attesting Officer*  *Director of the United States Patent and Trademark Office*